(12) United States Patent
Hiruta et al.

(10) Patent No.: US 7,368,363 B2
(45) Date of Patent: May 6, 2008

(54) METHOD OF MANUFACTURING SEMICONDUCTOR DEVICE AND METHOD OF TREATING SEMICONDUCTOR SURFACE

(75) Inventors: Reiko Hiruta, Nagano (JP); Hitoshi Kuribayashi, Nagano (JP); Ryosuke Shimizu, Tokyo (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 253 days.

(21) Appl. No.: 10/983,243

(22) Filed: Nov. 8, 2004

(65) Prior Publication Data
US 2005/0106847 A1    May 19, 2005

(30) Foreign Application Priority Data
Nov. 14, 2003    (JP)    ............... 2003-385966

(51) Int. Cl.
*H01L 21/76*    (2006.01)

(52) U.S. Cl. ............... 438/424; 257/E21.438

(58) Field of Classification Search ............... 438/424; 257/E21.438
See application file for complete search history.

(56) References Cited

U.S. PATENT DOCUMENTS

| 6,630,389 B2 | 10/2003 | Shibata et al. | |
|---|---|---|---|
| 2003/0219948 A1* | 11/2003 | Kuribayashi | ............... 438/270 |

FOREIGN PATENT DOCUMENTS

| JP | 10-012716 | 1/1998 |
|---|---|---|
| JP | 2003-229479 | 8/2003 |
| JP | 2003-282869 | 10/2003 |

* cited by examiner

*Primary Examiner*—Bradley K Smith
(74) *Attorney, Agent, or Firm*—Manabu Kanesaka

(57) ABSTRACT

A method of manufacturing a semiconductor device includes the steps of: exposing a semiconductor surface of a substrate; annealing the substrate in a hydrogen atmosphere at a hydrogen pressure between 200 Torr and 760 Torr and a temperature between 1000° C. and 1050° C. to planarize the exposed semiconductor surface; and forming a gate insulator film on the planarized semiconductor surface.

15 Claims, 14 Drawing Sheets

METHOD OF MANUFACTURING SEMICONDUCTOR DEVICE AND METHOD OF TREATING SEMICONDUCTOR SURFACE

BACKGROUND OF THE INVENTION AND RELATED ART STATEMENT

The present invention relates to a method of manufacturing a semiconductor device and a method of treating semiconductor surface including a step of annealing a semiconductor to planarize an exposed surface of the semiconductor. Specifically, the present invention relates to a method including a step of planarizing a region where a gate insulator film is formed before forming the gate insulator film; and a method including a step of planarizing a sidewall of a trench formed in a semiconductor substrate and rounding a corner of the trench simultaneously.

Conventionally, a semiconductor device manufactured by utilizing a trench includes a semiconductor device with a structure having a gate insulator film formed in a trench (hereinafter referred to as a trench MOS semiconductor device). Usually, the trench MOS semiconductor device is manufactured through a step of forming a gate insulator film in a trench after a step of forming the trench in the semiconductor. FIGS. 21 through 26 show arrangements of the trench MOS semiconductor device during a conventional manufacturing method. FIG. 21 is a top plan view of a principal part of the trench MOS semiconductor device. FIG. 22 is a cross sectional views taken along line 22-22 in FIG. 21 showing the arrangement during the conventional manufacturing method. FIGS. 23 to 26 are sectional views corresponding to FIG. 22 showing the arrangements during the conventional manufacturing method. FIG. 26 is a cross sectional view of the arrangement shown as the top plan view in FIG. 21.

As shown in FIGS. 21 and 26, a gate electrode 8 formed of poly-silicon is disposed in a trench 4 formed in a semiconductor substrate 1 with a gate insulator film 7 in between. The gate electrode 8 extends from an edge of the trench 4 to a thick oxide film 9. A metal wiring (not shown) is formed on the gate electrode 8 extending on the thick oxide film 9 with an interlayer insulator film in between. The gate electrode 8 is electrically connected to the metal wiring via a contact hole passing through the interlayer insulator film.

The conventional manufacturing method of the trench MOS semiconductor device will be described below. As shown in FIG. 22, the thick oxide film 9 is formed on the n-type silicon semiconductor substrate 1 including an $n^+$-type drain layer 11. Then, a p-type well region 2 is selectively formed in a surface layer of the semiconductor substrate 1. A mask 3 formed of a silicon oxide film having a desired pattern is formed on the well region 2. Then, the semiconductor at an opening of the mask 3 is removed to form the trench 4 with trench etching using the mask 3. In this step, an $SiO_2$ sidewall protective film 5 is formed on a sidewall of the trench 4.

Then, the sidewall protective film 5 is removed with an HF etchant as shown in FIG. 23. In this step, an edge of the mask 3 retracts from an opening edge of the trench 4, thereby widening the opening of the mask 3. As shown in FIG. 24, isotropic etching is conducted to remove a damaged portion in an inner surface of the trench 4. In this step, sidewalls 41 and 42 of the trench 4 are planarized, and corners 43 and 44 at a bottom of the trench 4 are rounded. A sacrifice oxide film 6 is formed by thermal oxidation as shown in FIG. 25.

Then, the sacrifice oxide film 6 is removed. As a result, corners 45 and 46 at the trench opening edge are rounded as shown in FIG. 26, and a foreign material in the trench 4 is removed. The gate insulator film 7 is formed, and a space inside the gate insulator film 7 in the trench 4 is filled with a poly-silicon layer to form a gate electrode 8. The poly-silicon layer is etch-backed except a region for drawing the gate electrode 8 to the thick oxide film 9 as shown in FIG. 26. The trench MOS semiconductor device is completed by forming a source and the like.

In the conventional manufacturing method, it is necessary to make the sacrifice oxide film 6 thick for rounding the trench corners 45 and 46 at the trench opening edge. Further, when the sidewall protective film 5 is removed, the mask edge retracts from the trench opening edge, thereby increasing a width of the trench 4 in the subsequent isotropic etching step. An increment in the width of the trench 4 depends on a retract length of the mask 3, thereby causing a variation in the opening width of the trench 4. Due to the variation, it is difficult to accurately position the mask used in the following step, thereby making it difficult to obtain a fine structure.

In view of the problems described above, a method of rounding a trench corner and planarizing a trench sidewall without widening a trench opening width has been proposed, in which an annealing treatment is performed in a hydrogen atmosphere after removing a protective film formed on the trench sidewall and before forming a gate insulator film (refer to Japanese Patent Application No. 2002-024778). However, in the method described in the above identified patent application, it is still difficult to effectively control surface roughness of the trench sidewall.

Similar to the method disclosed in Japanese Patent Application No. 2002-024778, Japanese Patent Publication (Kokai) No. 2002-231945 has described that reduction in surface roughness (average roughness) Ra of a trench sidewall depends on an annealing temperature in a hydrogen atmosphere. Japanese Patent Publication (Kokai) No. 2002-231945 has reported that when the annealing was performed at 950° C., 1050° C., and 1150° C., the surface roughness Ra of the trench sidewall was reduced as compared with the surface roughness Ra before the annealing.

However, in Japanese Patent Publication (Kokai) No. 2002-231945, the surface roughness Ra obtained through the annealing at a temperature of 950° C. or higher in a hydrogen atmosphere is about 1.0, indicating that the surface is not flat enough. The surface roughness Ra is an average value of irregularities over the entire surface. Therefore, even through the average value of irregularities over the entire surface is 1.0, a large convex portion or concave portion exceeding the average value may still exist locally. When such a large irregularity exists on the semiconductor surface at the gate insulator film forming region, dielectric breakdown may happen at the irregularity.

In view of the problems described above, an object of the present invention is to provide a method of manufacturing a semiconductor device and a method of treating a semiconductor surface to planarize a semiconductor surface, especially the semiconductor surface at a gate insulator film forming region, to have surface roughness Rms (standard deviation of roughness) less than 0.5.

Another object of the invention is to provide a method of manufacturing a trench MOS semiconductor device to round a trench corner and planarize a surface of a trench sidewall to have surface roughness Rms less than 0.5.

Further objects and advantages of the invention will be apparent from the following description of the invention.

SUMMARY OF THE INVENTION

In order to attain the objects described above, according to a first aspect of the invention, a method of manufacturing a semiconductor device includes the steps of: exposing a semiconductor surface of a substrate; annealing the substrate in a hydrogen atmosphere at a hydrogen pressure between 200 Torr and 760 Torr and a temperature between 1000° C. and 1050° C. to planarize the exposed semiconductor surface; and forming a gate insulator film on the planarized semiconductor surface.

According to a second aspect of the invention, a method of manufacturing a semiconductor device includes the steps of: exposing a semiconductor surface of a substrate; annealing the substrate in a hydrogen atmosphere at a hydrogen pressure between 300 Torr and 500 Torr and a temperature between 1000° C. and 1050° C. to planarize the exposed semiconductor surface; and forming a gate insulator film on the planarized semiconductor surface.

In the first and second aspects, in the step of annealing, silicon atoms diffuse (migrate) in the semiconductor surface, so that the semiconductor surface is planarized at a gate insulator film forming region such as a trench sidewall in an atomic level, thereby obtaining the semiconductor surface with a standard deviation of roughness Rms less than 0.5.

According to a third aspect of the invention, a method of manufacturing a semiconductor device includes the steps of: forming a trench in a semiconductor substrate; annealing the semiconductor substrate in a hydrogen atmosphere at a hydrogen pressure between 200 Torr and 760 Torr and a temperature between 1000° C. and 1050° C. to round a corner of the trench and planarize a sidewall of the trench; and forming a gate insulator film on an inner surface of the trench with the rounded corner and the planarized sidewall.

According to a fourth aspect of the invention, a method of manufacturing a semiconductor device includes the steps of: forming a trench in a semiconductor substrate; annealing the semiconductor substrate in a hydrogen atmosphere at a hydrogen pressure between 300 Torr and 500 Torr and a temperature between 1000° C. and 1050° C. to round a corner of the trench and to planarize a sidewall of the trench; and forming a gate insulator film on an inner surface of the trench with the rounded corner and the planarized sidewall.

In the third and fourth aspects, in the step of annealing, silicon atoms diffuse (migrate) in the surface, so that the sidewall of the trench is planarized in an atomic level, thereby obtaining the sidewall of the trench with the standard deviation of roughness Rms less than 0.5. Further, a portion with a small radius of curvature such as the trench corner is rounded.

According to a fifth aspect of the invention, a method of treating a semiconductor surface includes the step of: annealing a semiconductor substrate including an exposed semiconductor surface in a hydrogen atmosphere at a hydrogen pressure between 200 Torr and 760 Torr and a temperature between 1000° C. and 1050° C. to planarize the exposed semiconductor surface.

According to a sixth aspect of the invention, a method of treating a semiconductor surface includes the step of: annealing a substrate including an exposed semiconductor surface in a hydrogen atmosphere at a hydrogen pressure between 300 Torr and 500 Torr and a temperature between 1000° C. and 1050° C. to planarize the exposed semiconductor surface.

In the fifth and sixth aspects, in the step of annealing, silicon atoms diffuse (migrate) in the surface, so that the semiconductor surface such as a surface of a wafer is planarized in an atomic level, thereby obtaining the wafer with the standard deviation of roughness Rms less than 0.5.

According to a seventh aspect of the invention, a method of treating a semiconductor surface includes the step of: annealing a substrate including an exposed semiconductor surface in an atmosphere of a gas mixture containing an inert gas and hydrogen at a hydrogen partial pressure between 200 Torr and 760 Torr and a temperature between 1000° C. and 1050° C. to planarize the exposed semiconductor surface.

According to an eighth aspect of the invention, a method of treating a semiconductor surface includes the step of: annealing a substrate including an exposed semiconductor surface in an atmosphere of a gas mixture containing an inert gas and hydrogen at a hydrogen partial pressure between 300 Torr and 500 Torr and a temperature between 1000° C. and 1050° C. to planarize the exposed semiconductor surface.

In the seventh and eighth aspects, in the step of annealing, silicon atoms diffuse (migrate) in the surface, so that the wafer with the standard deviation of roughness Rms less than 0.5 can be obtained.

According to the invention, silicon atoms migrate during the step of annealing, so that the gate insulator film forming region such as the trench sidewall or the wafer surface is planarized in the atomic level, thereby obtaining the flat semiconductor surface with the standard deviation of roughness Rms less than 0.5. When the trench is formed in the semiconductor substrate, the trench sidewall is planarized, and a portion with a small radius of curvature such as the trench corner is rounded. Accordingly, in the trench MOS semiconductor device, it is possible to reduce a variation in a gate breakdown voltage and increase the gate breakdown voltage, thereby improving reliability and yield of the semiconductor device.

DETAILED DESCRIPTIONS OF PREFERRED EMBODIMENTS

Hereunder, embodiments of the invention will be described in detail with reference to the accompanied drawings. FIGS. 1 through 5 are schematic cross sectional views showing arrangements of a trench MOS semiconductor device in manufacturing steps according to an embodiment of the invention. First, a well region (not shown) is formed in a silicon semiconductor substrate 1 through a conventional manufacturing method of a trench MOS semiconductor device. Then, a silicon oxide film 31 is formed on the semiconductor substrate 1 as a mask.

Figure 1:
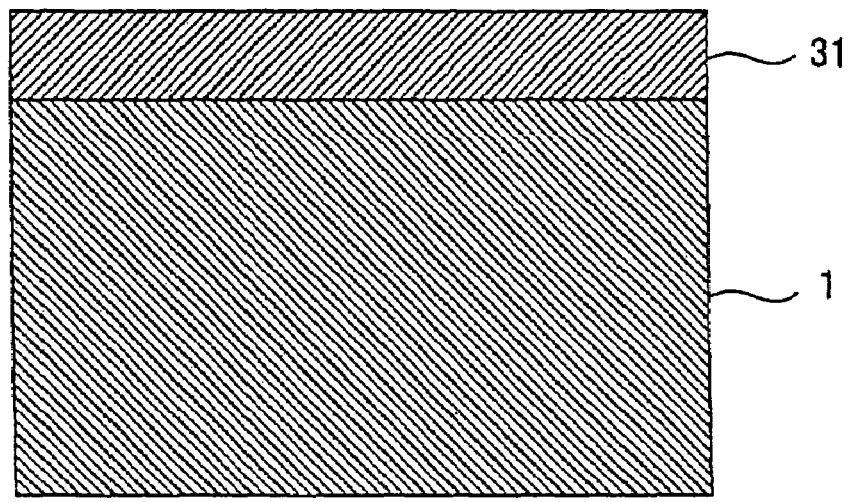
FIG. 1 is a schematic cross sectional view showing an arrangement of a trench MOS semiconductor device during a manufacturing step according to an embodiment of the invention.
Figure 2:
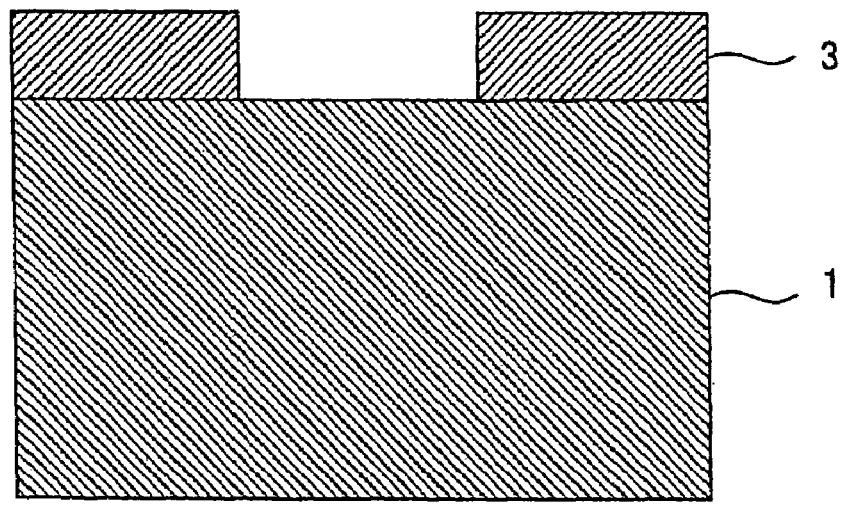
FIG. 2 is a schematic cross sectional view showing an arrangement of the trench MOS semiconductor device during the manufacturing step according to the embodiment of the invention.
Figure 3:
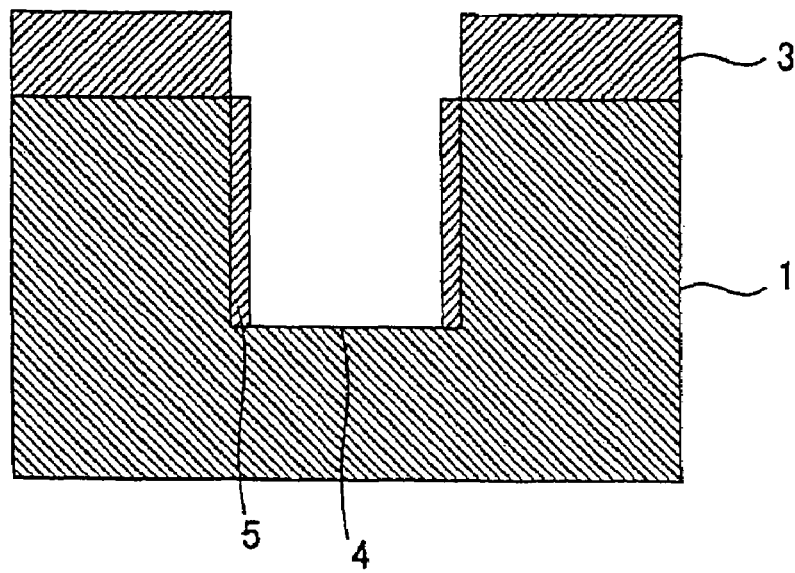
FIG. 3 is a schematic cross sectional view showing an arrangement of the trench MOS semiconductor device during the manufacturing step according to the embodiment of the invention.
Figure 4:
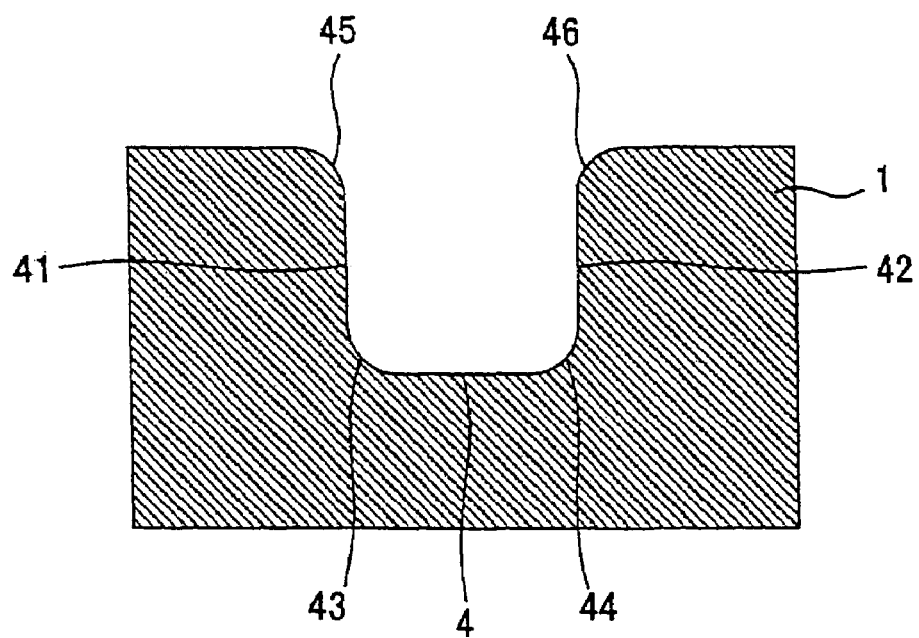
FIG. 4 is a schematic cross sectional view showing an arrangement of the trench MOS semiconductor device during the manufacturing step according to the embodiment of the invention.

A mask (not shown) formed of a photo resist having a pattern with an opening is formed on the silicon oxide film 31 for forming a trench forming region. The silicon oxide film 31 is etched using the resist mask to form a mask 3 having a predetermined trench pattern as shown in FIG. 2. A trench 4 is formed in the semiconductor substrate 1 by etching the semiconductor substrate with reactive ion etching (RIE) technique using the mask 3. Upon forming the trench 4, an $SiO_2$ sidewall protective film 5 is formed on the trench sidewall.

Then, the sidewall protective film 5 and the mask 3 are removed by etching using an HF etchant. The semiconductor substrate is washed with water and spin-dried. The washed semiconductor substrate is annealed in a hydrogen atmosphere. It is preferable (described later) to set an annealing temperature between 1000° C. and 1050° C. It is preferable to set a pressure inside a furnace between 200 Torr and 760 Torr. Alternatively, an atmosphere inside the furnace may be a gas mixture containing hydrogen and an inert gas. When an atmosphere is a gas mixture, it is preferable to set a hydrogen partial pressure between 200 Torr and 760 Torr. That is, in any atmosphere, it is preferable (described later) that the hydrogen pressure applied to the exposed semiconductor surface be between 200 Torr and 760 Torr. Argon, helium, or neon may be used as the inert gas in the hydrogen gas mixture. These inert gases may be used alone or in an appropriate combination.

Silicon atoms migrate during the step of annealing. Accordingly, trench sidewalls 41 and 42 exposed during the annealing are planarized, and trench corners 43, 44, 45 and 46 are rounded. It is preferable that the planarized trench sidewalls 41 and 42 have surface roughness (standard deviation of roughness) Rms less than 0.5 nm considering reliability of the gate insulator film 7. Therefore, the annealing is conducted so that the surface roughness (standard deviation of roughness) Rms of the trench sidewalls 41 and 42 becomes below 0.5 nm. The surface roughness (the standard deviation of roughness) Rms less than 0.5 nm is preferable for the following reason.

Crystal defects are removed during the annealing. Moreover, the exposed silicon surface is inactivated due to hydrogen termination, thereby reducing an adverse effect of contamination. An annealing time is selected appropriately considering the surface roughness of the trench sidewalls 41 and 42 and the roundness of the trench corners 43, 44, 45, and 46.

Figure 5:
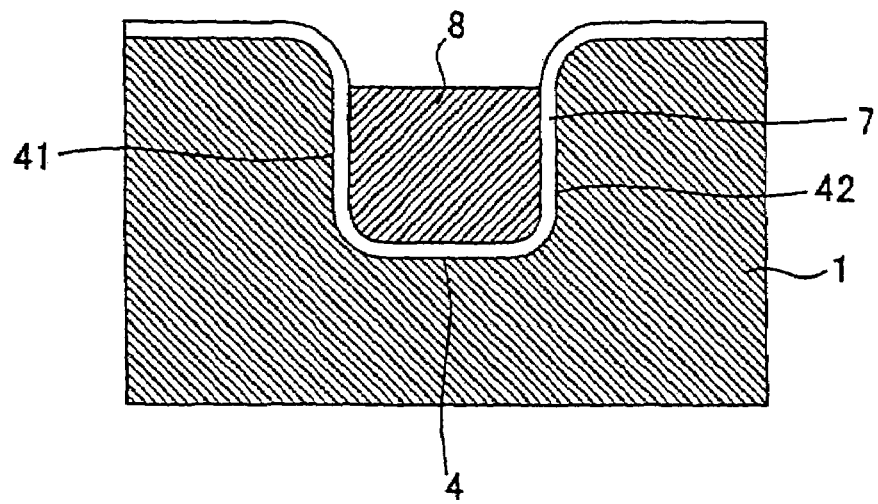
FIG. 5 is a schematic cross sectional view showing an arrangement of the trench MOS semiconductor device during the manufacturing step according to the embodiment of the invention.

After the step of annealing, the gate insulator film 7 is formed along an inner surface of the trench as shown in FIG. 5. A poly-silicon is deposited inside the gate insulator film 7 in the trench 4 to form a gate electrode 8. A source and a drain (not shown) are formed, and an interlayer insulator film (not shown) is deposited. A metal wiring (not shown) is formed, and a passivation film (not shown) is formed, thereby completing the trench MOS semiconductor device.

The surface roughness (the standard deviation of roughness) Rms less than 0.5 nm is preferable for the following reason. In a conventional manufacturing method, after the trench etching, a damage layer is removed, and the trench corners are rounded. Then, a sacrifice oxide film is formed through thermal oxidation to remove a foreign material. In an experiment, after the sacrifice oxide film was removed, the trench sidewall was observed with a transmission electron-microscope (TEM).

Figure 19:
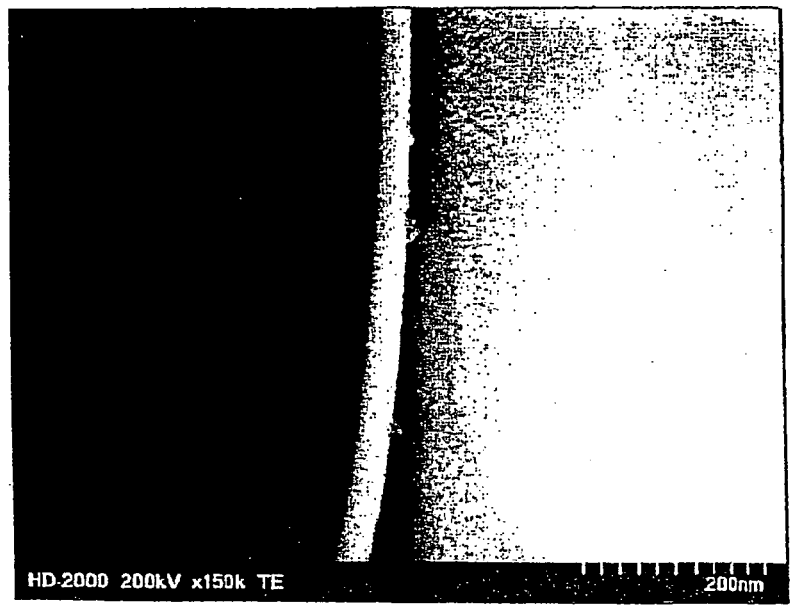
FIG. 19 is an enlarged image of a transmission electron microscope (TEM) showing a trench sidewall of a trench MOS semiconductor device manufactured by a conventional manufacturing method.
Figure 20:
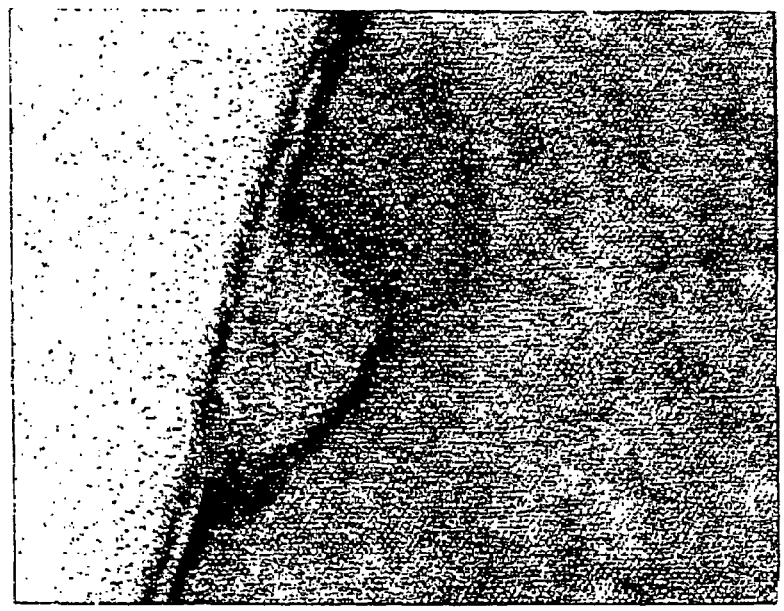
FIG. 20 is an image of the transmission electron microscope (TEM) showing an enlarged part of the image shown in FIG. 19.
Figure 21:
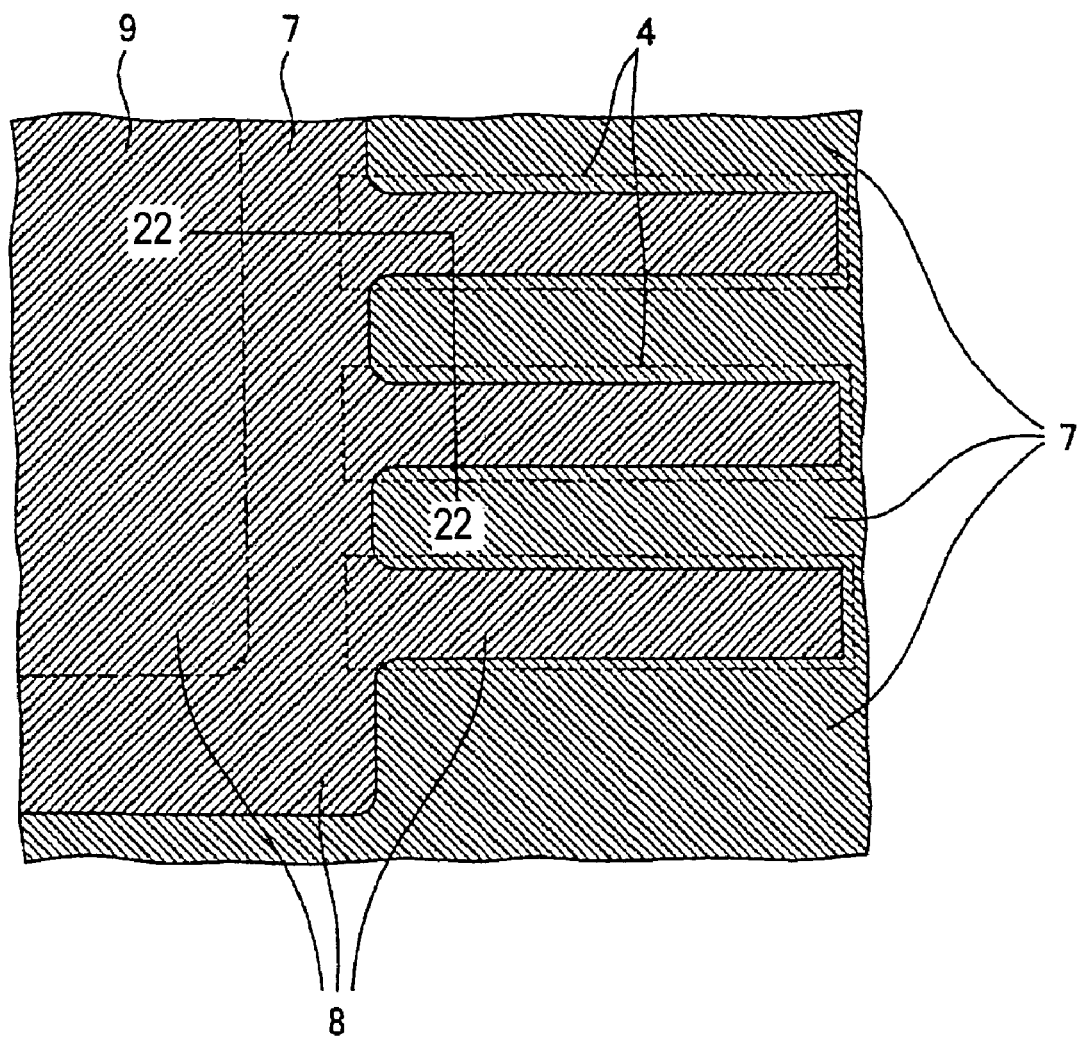
FIG. 21 is a plan view showing an arrangement of a trench MOS semiconductor device during a conventional manufacturing method.
Figure 22:
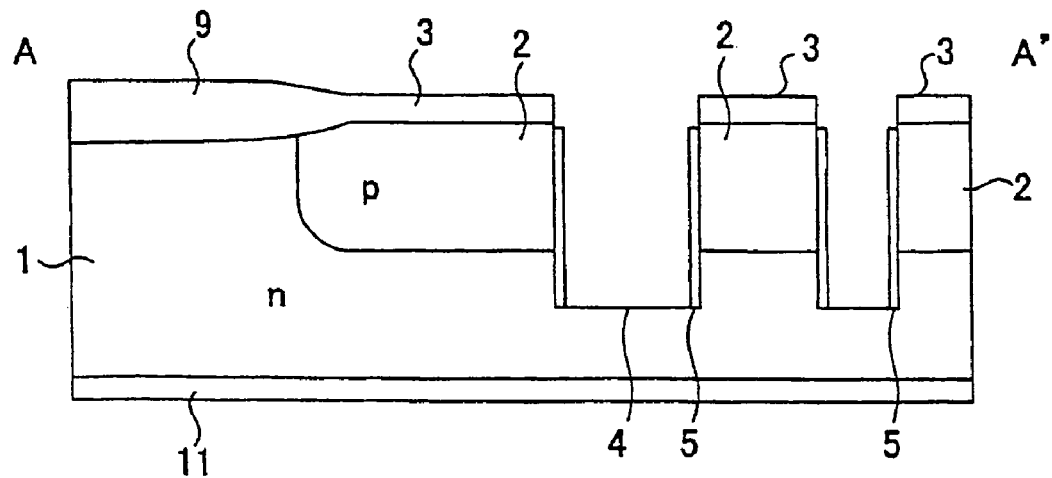
FIG. 22 is a cross sectional view showing an arrangement taken along line 22-22 in FIG. 21 in a step of the conventional manufacturing method.
Figure 23:
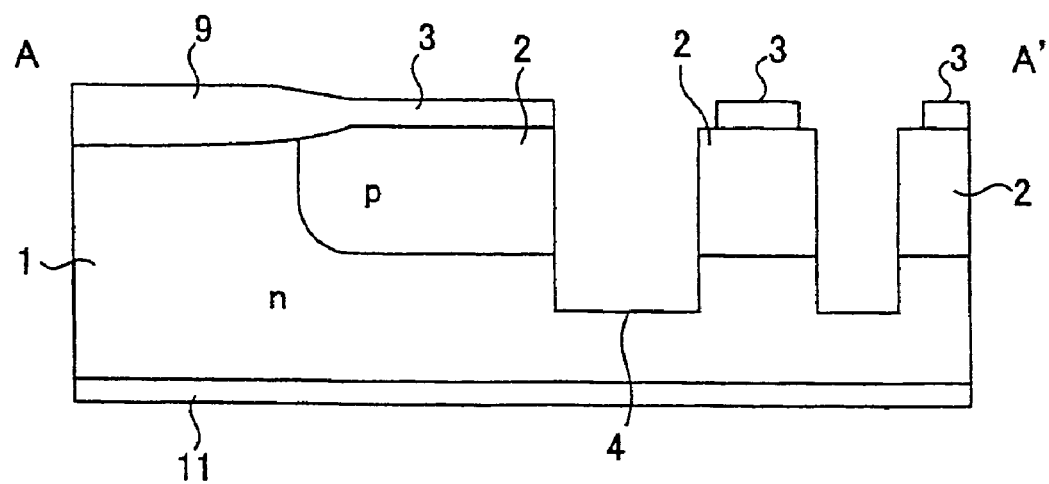
FIG. 23 is a cross sectional view showing an arrangement corresponding to FIG. 22 in a step of the conventional manufacturing method continued from FIG. 22.
Figure 24:
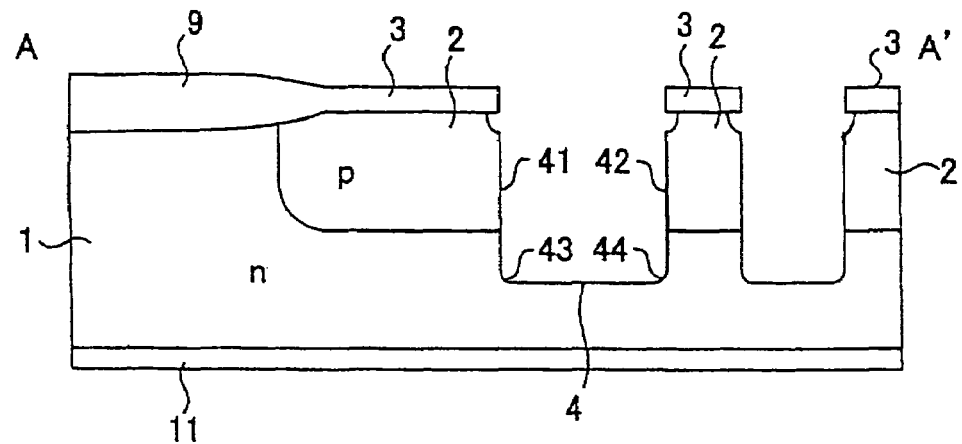
FIG. 24 is a cross sectional view showing an arrangement corresponding to FIG. 22 in a step of the conventional manufacturing method continued from FIG. 23.
Figure 25:
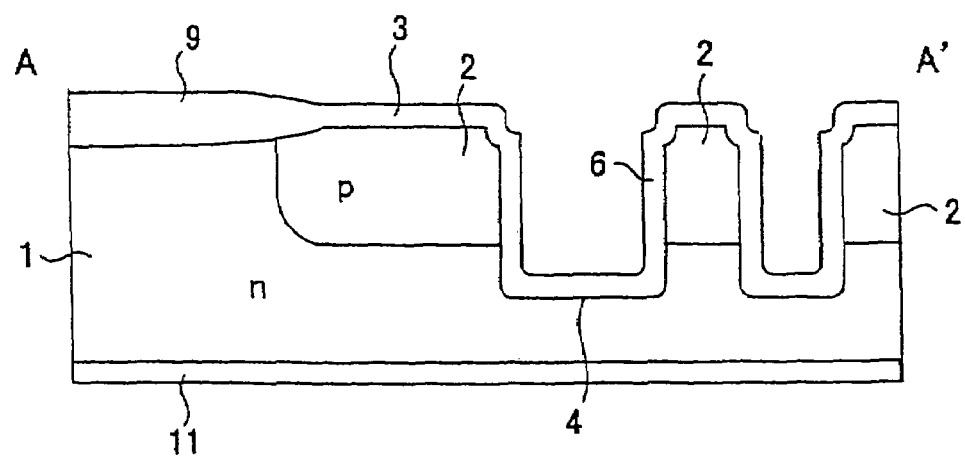
FIG. 25 is a cross sectional view showing an arrangement corresponding to FIG. 22 in a step of the conventional manufacturing method continued from FIG. 24.
Figure 26:
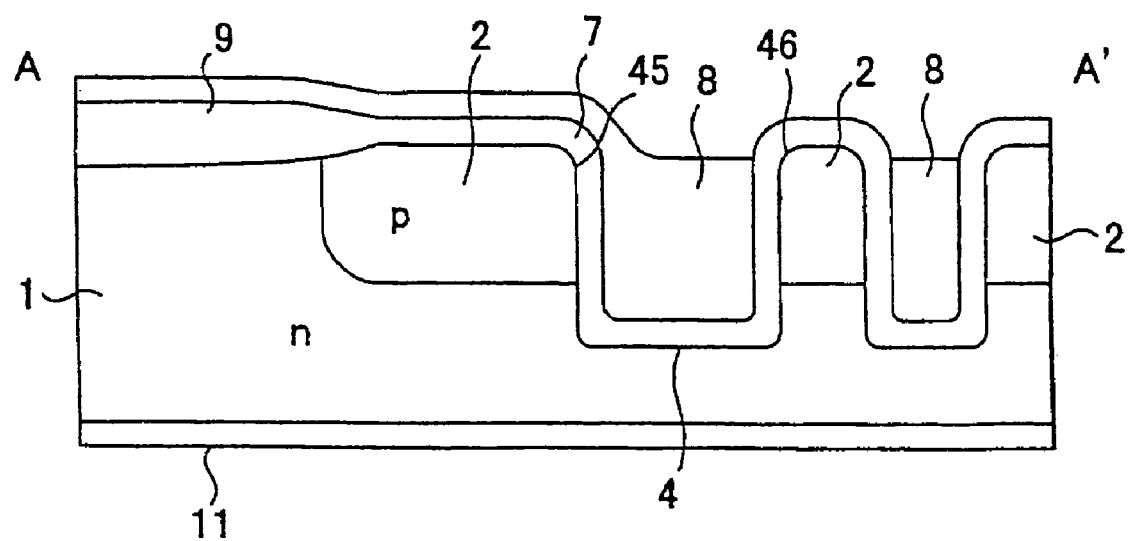
FIG. 26 is a cross sectional view showing an arrangement corresponding to FIG. 22 in a step of the conventional manufacturing method continued from FIG. 25.

FIG. 19 is a TEM image of a cross sectional of the trench sidewall. FIG. 20 is a TEM image showing an enlarged view of a defect (concave portion) formed in the trench sidewall. In FIG. 19, a black portion on the left half of the view represents the trench, a white portion on the right half of the view represents the silicon substrate, and a layer between the black and white portions represents the oxide film. As shown in FIGS. 19 and 20, concave portions having sizes of several tens nm are formed in the silicon portion of the trench sidewall with the conventional manufacturing method. According to a relation between the defects caused by the local irregularities and reliability of the device, it was found that the defects significantly impair reliability of the device. It was also found that it is necessary to provide the trench sidewall with flatness in an atomic level, and the surface roughness Rms less than 0.5 nm is effective for obtaining desirable reliability of the device.

When the semiconductor substrate is annealed in a hydrogen atmosphere, the hydrogen pressure in the furnace is preferably between 200 Torr and 760 Torr, or when the semiconductor substrate is annealed in an atmosphere of a gas mixture, the hydrogen partial pressure is preferably between 200 Torr and 760 Torr for the following reason. In an experiment, when the trench MOS semiconductor device was produced with the method described above, the semiconductor substrate was annealed at 1000° C. for 3 min in a hydrogen atmosphere before forming the gate insulator film. A relation between the pressure in the furnace and the surface roughness Rms of the trench sidewall after the annealing was evaluated. The pressures in the furnace at the annealing were set at 10 Torr, 40 Torr, 100 Torr, 300 Torr, 500 Torr, and 760 Torr, respectively.

Figure 6:
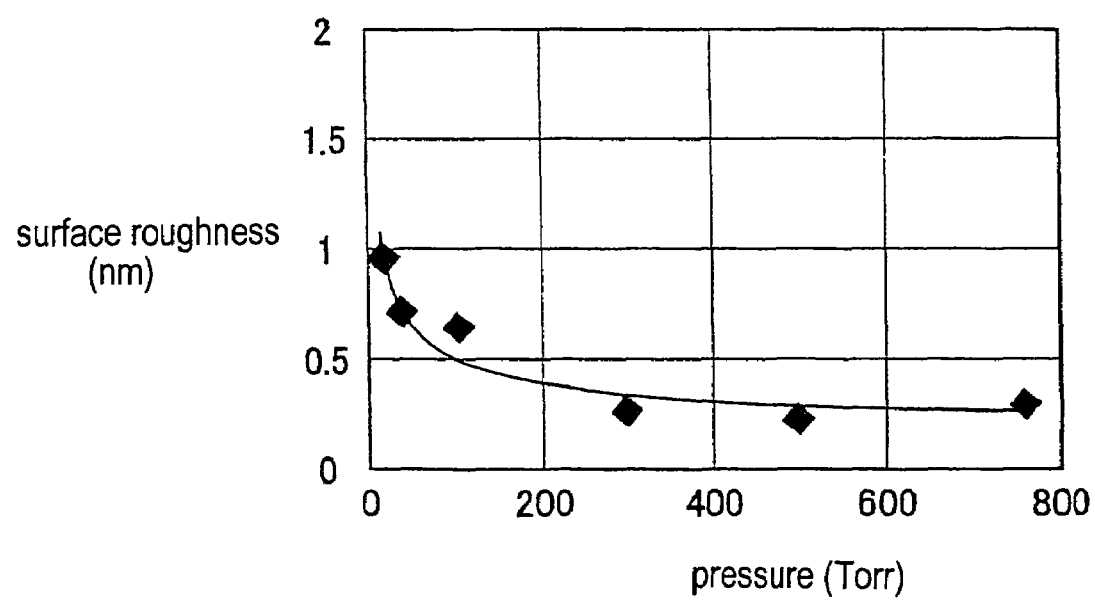
FIG. 6 is a graph showing a relationship between a hydrogen pressure in an annealing step and surface roughness of a trench sidewall of the trench MOS semiconductor device manufactured by the method of the invention.

Results are shown in FIGS. 6 to 12. FIG. 6 is a graph showing a relationship between the surface roughness Rms of the trench sidewall after the annealing and the pressure inside the furnace during the annealing. FIGS. 7 to 12 are atomic force microscopic (AFM) images of the trench sidewall surface annealed under the hydrogen pressure of 10 Torr, 40 Torr, 100 Torr, 300 Torr, 500 Torr, and 760 Torr, respectively.

Figure 7:
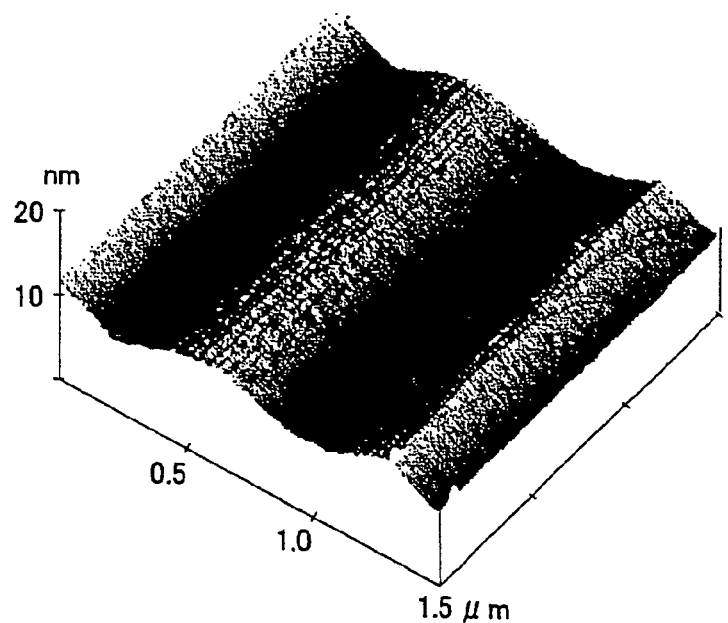
FIG. 7 is an enlarged image of an atomic force microscopic (AFM) showing the trench sidewall of the trench MOS semiconductor device manufactured by the method of the invention.
Figure 8:
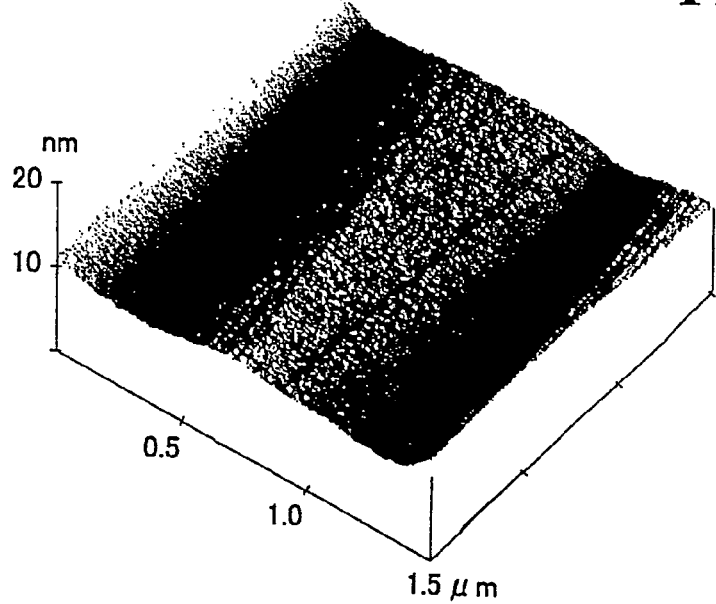
FIG. 8 is an enlarged AFM image showing the trench sidewall of the trench MOS semiconductor device manufactured by the method of the invention.
Figure 9:
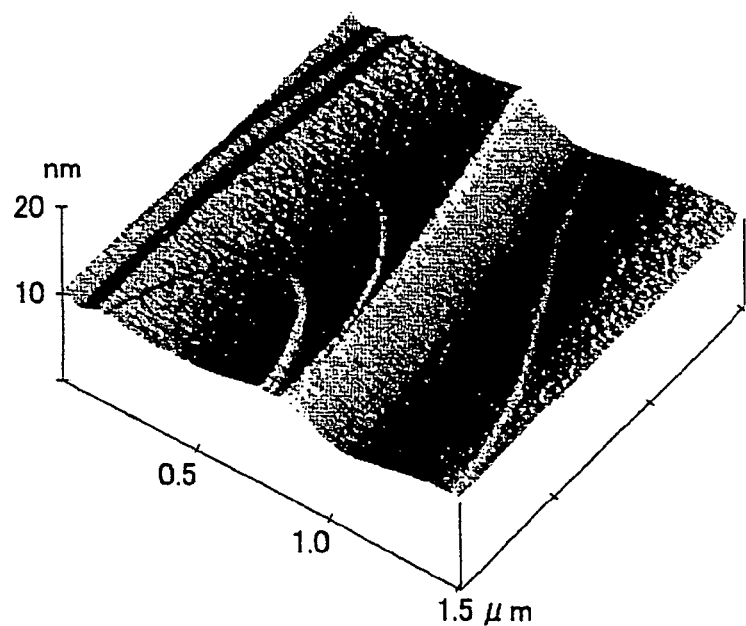
FIG. 9 is an enlarged AFM image showing the trench sidewall of the trench MOS semiconductor device manufactured by the method of the invention.
Figure 10:
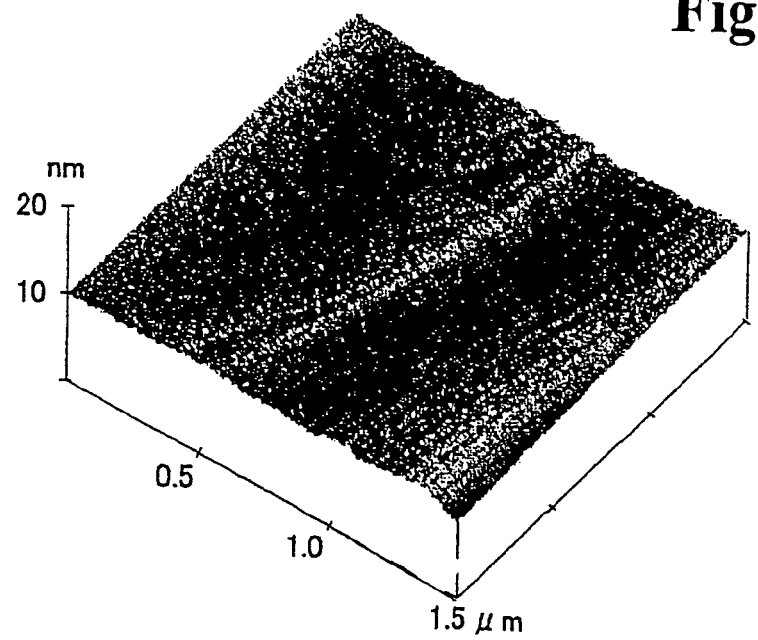
FIG. 10 is an enlarged AFM image showing the trench sidewall of the trench MOS semiconductor device manufactured by the method of the invention.
Figure 11:
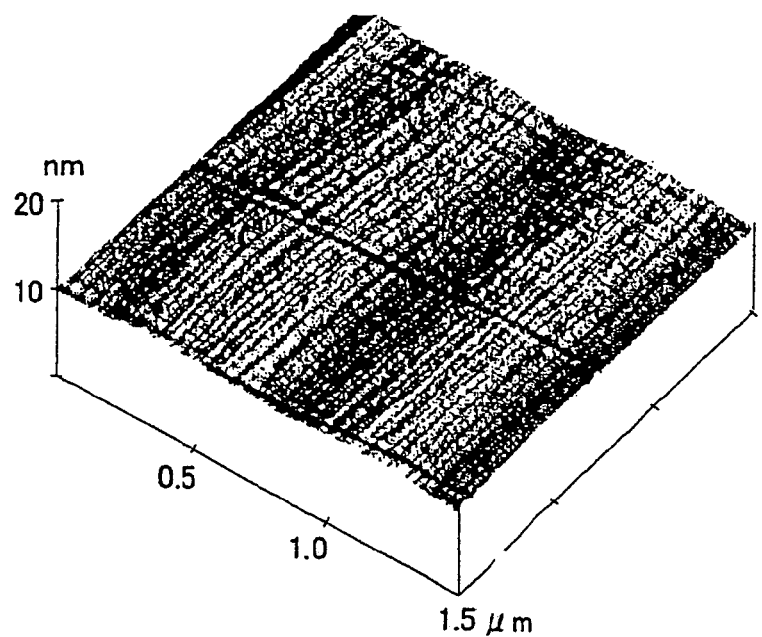
FIG. 11 is an enlarged AFM image showing the trench sidewall of the trench MOS semiconductor device manufactured by the method of the invention.
Figure 12:
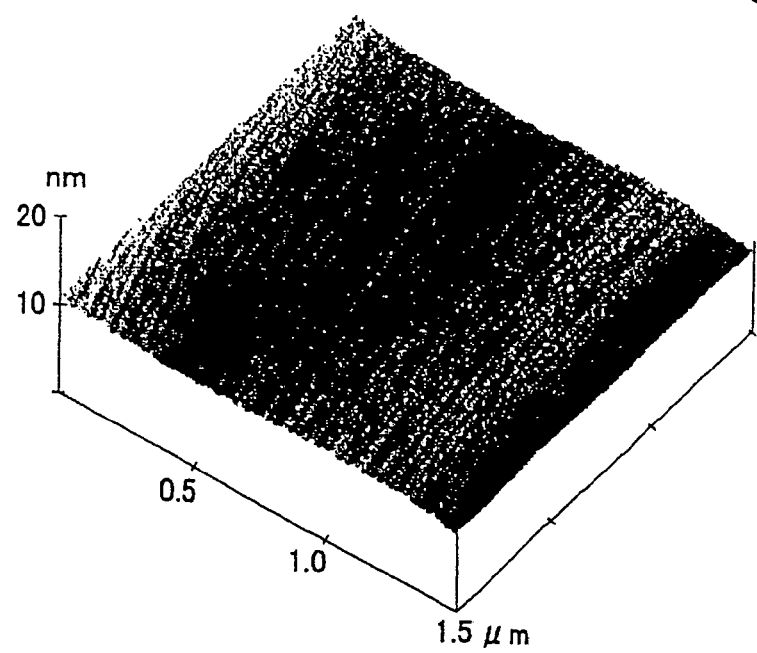
FIG. 12 is an enlarged AFM image showing the trench sidewall of the trench MOS semiconductor device manufactured by the method of the invention.

As shown in FIG. 6, the trench sidewall is sufficiently planarized to have the surface roughness Rms less than 0.5 nm through the annealing of the semiconductor substrate in a hydrogen atmosphere under the pressure between 200 Torr and 760 Torr, which is confirmed by the AFM images shown in FIGS. 7 to 12. As shown in FIGS. 10 through 12, when the pressure inside the furnace is 300 Torr or higher, the trench sidewall has a surface formed in a shape like a flat step terrace. In contrast, as shown in FIGS. 7 to 9, when the pressure inside the furnace is 100 Torr or lower, the trench sidewall has a wavy surface due to large local step bunching, thereby causing large surface roughness.

When the annealing was conducted in an atmosphere of the gas mixture, results similar to those shown in FIGS. 6 to 12 were obtained. In the case of the gas mixture, the hydrogen atmosphere in the above description may be replaced by the atmosphere of the gas mixture, and the pressure inside the furnace may replaced by the hydrogen partial pressure inside the furnace.

The annealing temperature is preferably between 1000° C. and 1050° C. for the following reason. At the annealing temperature lower than 1000° C., the trench sidewall is not planarized sufficiently and the trench corner is not rounded sufficiently even though silicon atoms migrate to some extent. On the other hand, at the annealing temperature higher than 1050° C., a reverse taper is formed in a trench shape due to bowing. If the trench shape has the reverse taper, when the trench is filled with the poly-silicon in the later step, a space (void) filled with the poly-silicon may be formed.

In an experiment, when the trench MOS semiconductor device was produced with the method described above, the semiconductor substrate was annealed for 3 min in an atmosphere of a gas mixture containing hydrogen and argon with a hydrogen partial pressure of 760 Torr. A relation between the annealing temperature and the surface roughness Rms of the trench sidewall after the annealing was evaluated. The annealing temperatures were set at 900° C., 1000° C., 1050° C., 1100° C., and 1150° C., respectively.

Figure 13:
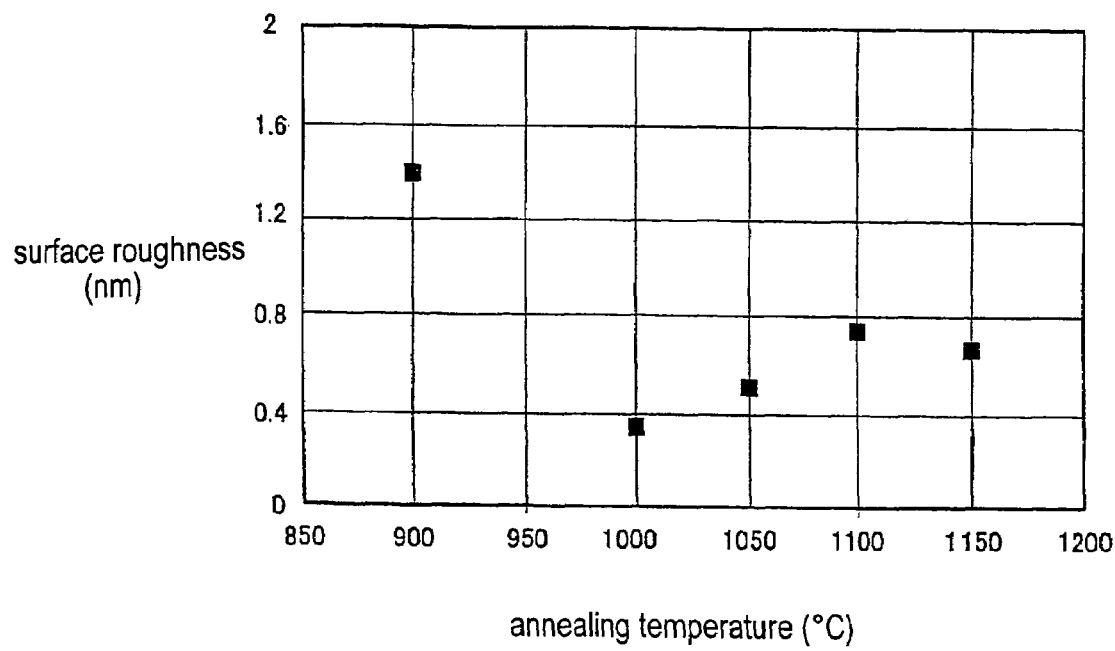
FIG. 13 is a graph showing a relationship between an annealing temperature and surface roughness of the trench sidewall of the trench MOS semiconductor device manufactured by the method of the invention.

Results are shown in FIGS. 13 to 18. FIG. 13 is a graph showing the relationship between the surface roughness Rms and the annealing temperature. FIGS. 14 to 18 are AFM images of the trench sidewall surface annealed at 900° C., 1000° C., 1050° C., 1100° C., and 1150° C., respectively.

Figure 14:
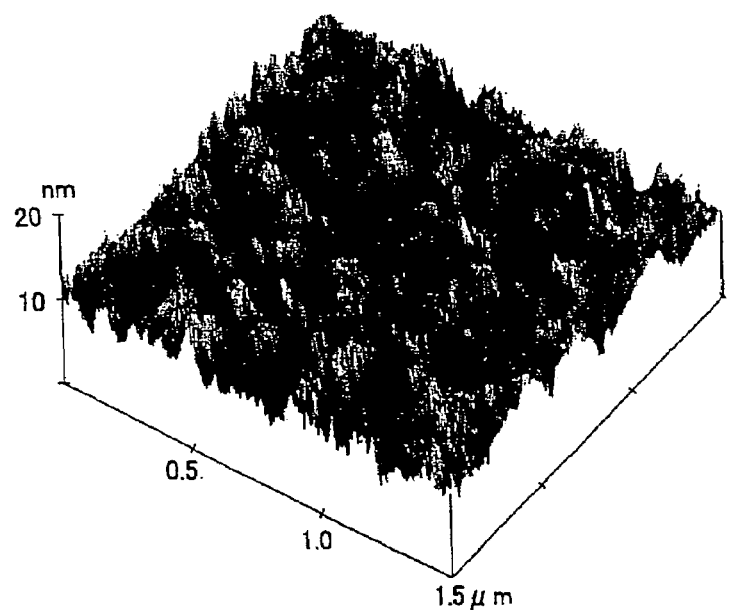
FIG. 14 is an enlarged AFM image showing the trench sidewall of the trench MOS semiconductor device manufactured by the method of the invention.
Figure 15:
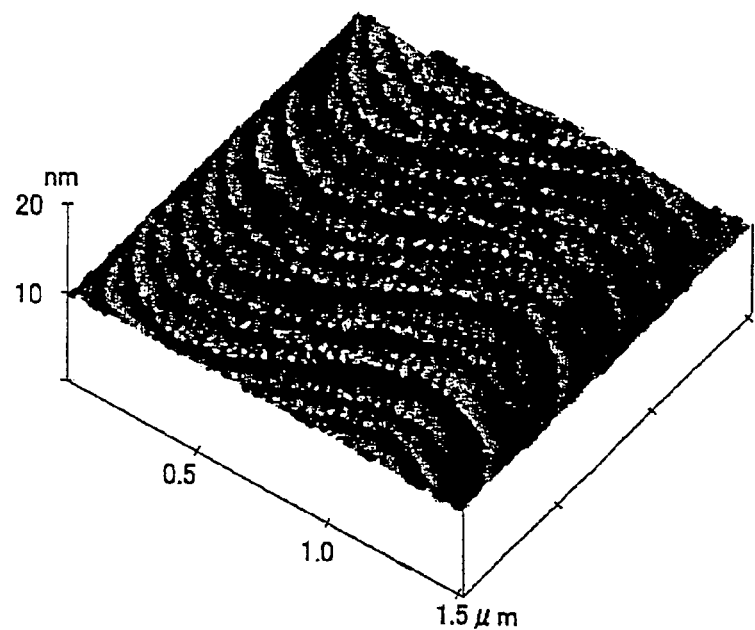
FIG. 15 is an enlarged AFM image showing the trench sidewall of the trench MOS semiconductor device manufactured by the method of the invention.
Figure 16:
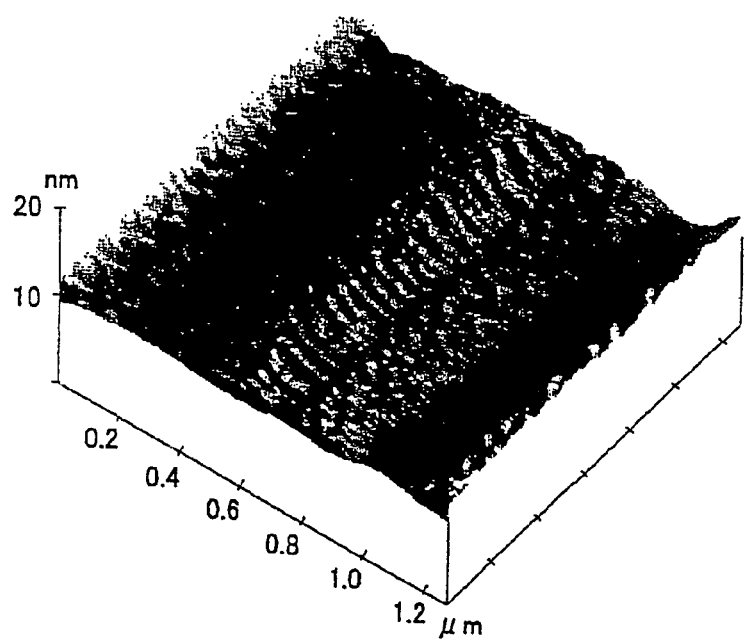
FIG. 16 is an enlarged AFM image showing the trench sidewall of the trench MOS semiconductor device manufactured by the method of the invention.

As shown in FIG. 13, the trench sidewall is sufficiently planarized to have the surface roughness Rms less than 0.5 nm through the annealing of the semiconductor substrate at a temperature between 1000° C. and 1050° C., which is confirmed by the AFM images shown in FIGS. 14 to 18. As shown in FIGS. 15 and 16, the trench sidewall has a surface shape like a flat step terrace and low surface roughness at the annealing temperature of 1000° C. or 1050° C.

Figure 17:
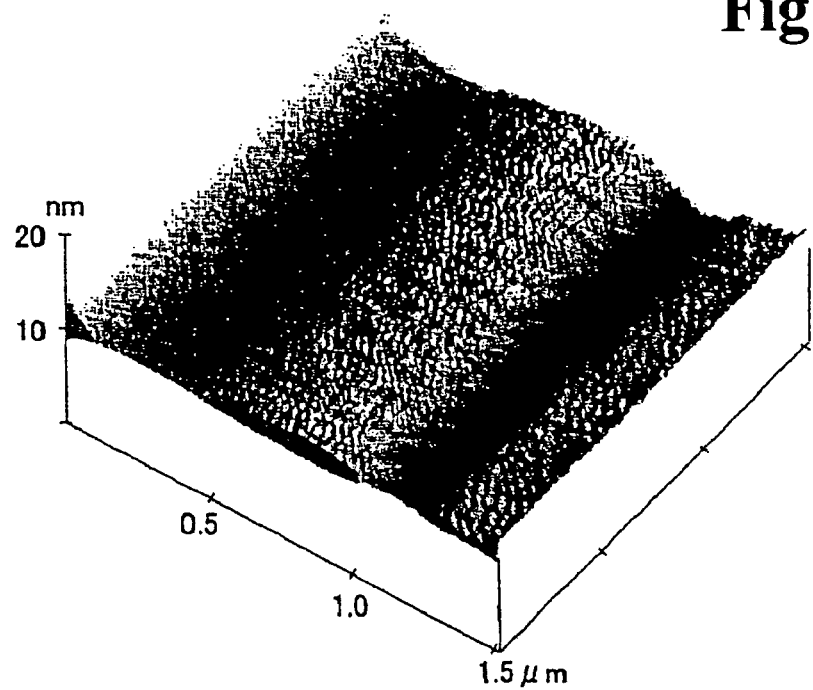
FIG. 17 is an enlarged AFM image showing the trench sidewall of the trench MOS semiconductor device manufactured by the method of the invention.
Figure 18:
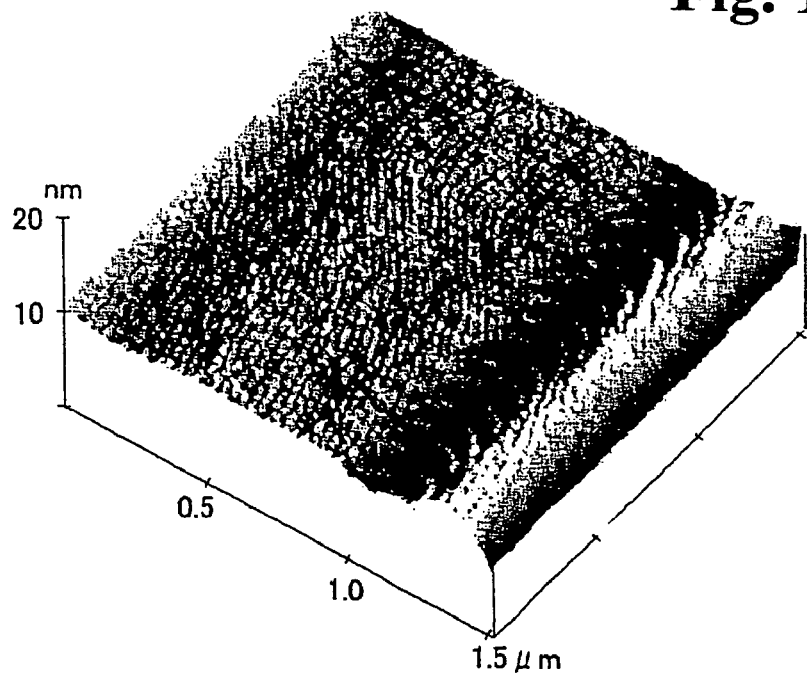
FIG. 18 is an enlarged AFM image showing the trench sidewall of the trench MOS semiconductor device manufactured by the method of the invention.

In contrast, as shown in FIGS. 17 and 18, when the annealing temperature is 1100° C. or 1150° C., the trench sidewall has a wavy surface due to large local step bunching, thereby causing large surface roughness. As shown in FIG. 14, the trench sidewall is. not planarized sufficiently when the annealing temperature is 900° C. Results similar to those shown in FIGS. 13 to 18 were obtained when the annealing is conducted in an atmosphere of the gas mixture.

The standard deviation of roughness Rms is used as an index of the surface roughness. The surface roughness (standard deviation of roughness) Rms is expressed by the following formula (1), wherein $Z_i$ is a Z value at each measuring point, $Z_{av}$ is an average value of the Z values, and N is the number of measuring points. The Z value is a value in a Z direction (height direction) at a measuring point in the AFM images shown FIGS. 7 to 12 and FIGS. 14 to 18.

$$Rms = \sqrt{\Sigma(Z_i - Z_{av})^2/N} \qquad (1)$$

The average roughness Ra is also used as an index of the surface roughness. The average roughness Ra is expressed by the following formula (2), wherein $Z_C$ is a Z value at a center plane. The standard deviation of roughness Rms is substantially the same as the average roughness Ra.

$$Ra = \sum_{i=1}^{N} |Z_i - Z_c|/N \qquad (2)$$

As described above, in the embodiments of the present invention, the trench 4 is formed in the semiconductor substrate 1, and the protective film 5 is removed from the trench sidewalls 41 and 42. The semiconductor substrate 1 is annealed in a hydrogen atmosphere having the hydrogen pressure between 200 Torr and 760 Torr before the gate insulator film 7 is formed. In the step of annealing, silicon atoms migrate, and the exposed semiconductor surface is planarized in the atomic level. Accordingly, it is possible to obtain the trench sidewalls 41 and 42 having the surface roughness Rms less than 0.5 nm. At the same time, the trench corners 43, 44, 45, and 46 are rounded by the annealing. The same effects are obtained by annealing the semiconductor substrate 1 in an atmosphere of the gas mixture having the hydrogen partial pressure between 200 Torr and 760 Torr. As a result, it is possible to reduce a variation in a gate breakdown voltage and increase the gate breakdown voltage, thereby improving reliability of the trench MOS semiconductor device and yield thereof in manufacturing.

In the embodiments of the present invention, after the mask 3 used for forming the trench is removed, the annealing is conducted. Accordingly, it is possible to obtain the smooth semiconductor surface with no protrusion as compared with a case of annealing the semiconductor substrate with the mask 3 left thereon. As a result, in the MOS-FET (insulated gate field effect transistor) having a trench gate structure, when an electrode is formed in the trench and drawn out onto the semiconductor substrate surface, it is possible to maintain the gate breakdown voltage.

As described above, according to the invention, it is possible to planarize the trench sidewalls and round the trench corners. It is also possible to planarize the semiconductor surface other than the trench surface, for example, a gate insulator film forming region in a semiconductor device with a planar structure and a semiconductor wafer surface.

As described above, according to the invention, the method of manufacturing a semiconductor device and the method of treating a semiconductor surface are useful for manufacturing a semiconductor device having a trench gate structure. Especially, the method of manufacturing a semiconductor device and the method of treating a semiconductor surface according to the invention are suited for manufacturing a power MOSFET having a trench gate structure and an insulated gate bipolar transistor (IGBT) having a trench gate structure.

The disclosure of Japanese Patent Application No. 2003-385966, filed on Nov. 14, 2003, is incorporated in the application.

While the invention has been explained with reference to the specific embodiments of the invention, the explanation is illustrative and the invention is limited only by the appended claims.

What is claimed is:

1. A method of manufacturing a semiconductor device, comprising:
    exposing a semiconductor surface of a substrate;
    annealing the substrate in a hydrogen atmosphere at a pressure between 200 Torr and 500 Torr and a temperature between 1000° C. and 1050° C. to planarize the semiconductor surface; and
    forming a gate insulator film on the semiconductor surface,
    wherein the planarizing reduces a standard deviation of roughness (Rms) to 0.5 µm or less.

2. A method of manufacturing a semiconductor device according to claim 1, wherein in the step of annealing the substrate, said hydrogen pressure is maintained between 300 Torr and 500 Torr.

3. A method of manufacturing a semiconductor device according to claim 1, wherein the pressure of the hydrogen atmosphere comprises a hydrogen partial pressure.

4. A method of manufacturing a semiconductor device, comprising:
    forming a trench in a semiconductor substrate;
    annealing the semiconductor substrate in a hydrogen atmosphere at a hydrogen pressure between 200 Torr and 500 Torr and a temperature between 1000° C. and 1050° C. to round corners of the trench and to planarize a sidewall of the trench; and
    forming a gate insulator film on an inner surface of the trench,
    wherein the planarizing reduces a standard deviation of roughness (Rms) to 0.5 µm or less.

5. A method of manufacturing a semiconductor device according to claim 4, wherein in the step of annealing the semiconductor substrate, said hydrogen pressure is maintained between 300 Torr and 500 Torr.

6. A method of manufacturing a semiconductor device according to claim 4, wherein the pressure of the hydrogen atmosphere comprises a hydrogen partial pressure.

7. A method of treating a semiconductor surface, comprising:
    annealing a substrate having an exposed semiconductor surface in a hydrogen atmosphere at a hydrogen pressure between 200 Torr and 500 Torr and a temperature between 1000° C. and 1050° C. to planarize the exposed semiconductor surface,
    wherein the annealing planarizes the exposed semiconductor surface to a standard deviation of roughness (Rms) to 0.5 µm or less.

8. A method of manufacturing a semiconductor device according to claim 7, wherein in the step of annealing the substrate, said hydrogen pressure is maintained between 300 Torr and 500 Torr.

9. A method of treating a semiconductor device according to claim 7, wherein the pressure of the hydrogen atmosphere comprises a hydrogen partial pressure.

10. A method of treating a semiconductor surface, comprising:
    annealing a substrate having an exposed semiconductor surface in an atmosphere of a gas mixture containing an inert gas and hydrogen at a hydrogen partial pressure between 200 Torr and 500 Torr and a temperature between 1000° C. and 1050° C. to planarize the exposed semiconductor surface,
    wherein the planarizing reduces the standard deviation of roughness (Rms) to 0.5 µm or less.

11. A method of manufacturing a semiconductor device according to claim 10, wherein in the step of annealing the substrate, said hydrogen partial pressure is maintained between 300 Torr and 500 Torr.

12. A method of manufacturing a semiconductor device comprising:
    exposing a semiconductor surface of a substrate;
    annealing the substrate in a hydrogen atmosphere at a pressure between 200 Torr and 500 Torr and a temperature between 1000° C. and 1050° C. to planarize the semiconductor surface; and
    forming a gate insulator film on the semiconductor surface,
    wherein the hydrogen atmosphere is 100% hydrogen.

13. A method of manufacturing a semiconductor device comprising:
   forming a trench in a semiconductor substrate;
   annealing the semiconductor substrate in a hydrogen atmosphere at a hydrogen pressure between 200 Torr and 500 Torr and a temperature between 1000° C. and 1050° C. to round corners of the trench and to planarize a sidewall of the trench; and
   forming a gate insulator film on an inner surface of the trench,
   wherein the hydrogen atmosphere is 100% hydrogen.

14. A method of treating a semiconductor device comprising:
   annealing a substrate having an exposed semiconductor surface in a hydrogen atmosphere at a hydrogen pressure between 200 Torr and 500 Torr and a temperature between 1000° C. and 1050° C. to planarize the exposed semiconductor surface,
   wherein the hydrogen atmosphere is 100% hydrogen.

15. A method of treating a semiconductor device comprising:
   annealing a substrate having an exposed semiconductor surface in an atmosphere of a gas mixture containing an inert gas and hydrogen at a hydrogen partial pressure between 200 Torr and 500 Torr and a temperature between 1000° C. and 1050° C. to planarize the exposed semiconductor surface,
   wherein the hydrogen atmosphere is 100% hydrogen.

* * * * *